US007402497B2

(12) United States Patent
Wei et al.

(10) Patent No.: US 7,402,497 B2
(45) Date of Patent: Jul. 22, 2008

(54) TRANSISTOR DEVICE HAVING AN INCREASED THRESHOLD STABILITY WITHOUT DRIVE CURRENT DEGRADATION

(75) Inventors: Andy Wei, Dresden (DE); Thorsten Kammler, Ottendorf-Okrilla (DE); Jan Hoentschel, Dresden (DE); Manfred Horstmann, Duerrrhoehrsdorf-Ditterbach (DE)

(73) Assignee: Advanced Micro Devices, Inc., Austin, TX (US)

( * ) Notice: Subject to any disclaimer, the term of this patent is extended or adjusted under 35 U.S.C. 154(b) by 18 days.

(21) Appl. No.: 11/551,263

(22) Filed: Oct. 20, 2006

(65) Prior Publication Data
US 2007/0202641 A1    Aug. 30, 2007

(30) Foreign Application Priority Data
Feb. 28, 2006 (DE) .................. 10 2006 009 226

(51) Int. Cl.
*H01L 21/336* (2006.01)
(52) U.S. Cl. ................... 438/300; 257/E21.618; 257/E21.633
(58) Field of Classification Search .......... 438/300; 257/E21.618, E21.633
See application file for complete search history.

(56) References Cited

U.S. PATENT DOCUMENTS

| 5,908,313 | A | * | 6/1999 | Chau et al. ............ 438/299 |
|---|---|---|---|---|
| 6,010,936 | A | | 1/2000 | Son .................... 438/303 |
| 6,239,472 | B1 | | 5/2001 | Shenoy ................ 257/408 |
| 6,274,894 | B1 | * | 8/2001 | Wieczorek et al. ...... 257/192 |
| 6,372,583 | B1 | | 4/2002 | Tyagi .................. 438/300 |
| 6,657,223 | B1 | | 12/2003 | Wang et al. ............ 257/19 |
| 2002/0072176 | A1 | | 6/2002 | Park et al. ............ 438/286 |
| 2002/0190284 | A1 | * | 12/2002 | Murthy et al. .......... 257/286 |
| 2004/0166611 | A1 | * | 8/2004 | Liu .................... 438/142 |
| 2005/0012146 | A1 | | 1/2005 | Murthy et al. .......... 257/336 |
| 2005/0215024 | A1 | | 9/2005 | Nahm et al. ........... 438/420 |
| 2006/0038230 | A1 | | 2/2006 | Ueno et al. ............ 257/351 |
| 2006/0068555 | A1 | * | 3/2006 | Zhu et al. ............. 438/303 |
| 2006/0172511 | A1 | * | 8/2006 | Kammler et al. ........ 438/481 |

FOREIGN PATENT DOCUMENTS

EP    1677360 A2    5/2006    ............ 29/78

OTHER PUBLICATIONS

Search Report and Written Opinion Dated Aug. 2, 2007 for Serial No. PCT/US2007/004544.

* cited by examiner

*Primary Examiner*—Trung Dang
(74) *Attorney, Agent, or Firm*—Williams, Morgan & Amerson, P.C.

(57) ABSTRACT

By removing a portion of a halo region or by avoiding the formation of the halo region within the extension region, which may be subsequently formed on the basis of a re-grown semiconductor material, the threshold roll off behavior may be significantly improved, wherein an enhanced current drive capability may simultaneously be achieved.

19 Claims, 4 Drawing Sheets

TRANSISTOR DEVICE HAVING AN INCREASED THRESHOLD STABILITY WITHOUT DRIVE CURRENT DEGRADATION

BACKGROUND OF THE INVENTION

1. Field of the Invention

Generally, the present invention relates to the formation of integrated circuits, and, more particularly, to the formation of semiconductor regions including enhanced dopant profiles formed by means of halo regions.

2. Description of the Related Art

The fabrication of integrated circuits requires the formation of a large number of circuit elements on a given chip area according to a specified circuit layout. For this purpose, substantially crystalline semiconductor regions with or without additional dopant materials are defined at specified substrate locations to act as "active" regions, that is, to act, at least temporarily, as conductive areas. Generally, a plurality of process technologies are currently practiced, wherein, for complex circuitry, such as microprocessors, storage chips and the like, MOS technology is currently one of the most promising approaches, due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A transistor, irrespective of whether an N-channel transistor or a P-channel transistor or any other transistor architecture is considered, comprises so-called PN junctions that are formed by an interface of highly doped regions, such as drain and source regions, with a slightly doped or non-doped region, such as a channel region, disposed adjacent to the highly doped regions.

In the case of a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel, due to the application of an appropriate control voltage to the gate electrode, depends on the dopant concentration, the mobility of the charge carriers, and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity and the increase of gate resistivity, renders the channel length a dominant design criterion for accomplishing an increase in the operating speed of the integrated circuits.

The continuing shrinkage of the transistor dimensions, however, entails a plurality of issues associated therewith that have to be addressed so as to not unduly offset the advantages obtained by steadily decreasing the dimensions of transistors. One major problem in this respect is the development of enhanced photolithography and etch strategies to reliably and reproducibly create circuit elements of critical dimensions, such as the gate electrode of the transistors, for a new device generation. Moreover, highly sophisticated dopant profiles, in the vertical direction as well as in the lateral direction, are required in the drain and source regions to provide low sheet and contact resistivity in combination with a desired channel controllability.

However, the reduction of the gate length is associated with a reduced controllability of the respective channel, thereby requiring pronounced lateral dopant profiles and dopant gradients, at least in the vicinity of the PN junctions. Therefore, so-called halo regions are usually formed by ion implantation in order to introduce a dopant species whose conductivity type corresponds to the conductivity type of the remaining channel and semiconductor region so as to "reinforce" the resulting PN junction dopant gradient after the formation of respective extension and deep drain and source regions. In this way, the threshold voltage of the transistor, which represents the voltage at which a conductive channel forms in the channel region, significantly determines the controllability of the channel, wherein a significant variance of the threshold voltage may be observed for reduced gate lengths. Hence, by providing an appropriate halo implantation region, the controllability of the channel may be enhanced, thereby also reducing the variance of the threshold voltage, which is also referred to as threshold roll off, and also reducing significant variations of transistor performance with a variation in gate length. With the ongoing shrinkage of the gate length, however, an efficient compensation for threshold variance by a halo implantation may result in a significant degree of counter-doping of the respective extension regions, in particular when very shallow and thus highly doped halo implantations are required, which may more efficiently reduce the threshold variance compared to deeper halo implantations, which may be provided with a reduced dopant concentration yet provide a less efficient compensation mechanism. Consequently, the channel controllability may be enhanced by reducing the thickness of the gate insulation layer, which may however be restricted by increased static leakage currents and the physical limits of well-approved insulating materials, such as silicon dioxide.

With reference to FIGS. 1a-1c, the problems involved in the formation of conventional transistor devices will be described in more detail. FIG. 1a schematically illustrates in a cross-sectional view a first transistor element 100S, which may receive a shallow halo implantation, and a second transistor element 100D for receiving a moderately deep implantation. The first and second transistors 100S, 100D may comprise respective gate electrodes 104 that are formed above a channel region 103 provided in a semiconductor material 102, such as a silicon layer, which in turn is formed above a substrate 101. The gate electrode 104, which may have formed on sidewalls thereof a spacer element 107, is separated from the channel region 103 by a gate insulation layer 105. It may be assumed that the transistors 100S, 100D may have substantially the same configuration with respect to the components described so far. Moreover, the transistor 100S may be subjected to an ion implantation process 108S for forming in the semiconductor layer 102 respective halo regions 106S, which may be considered as shallow halo regions, which may be highly efficient in enhancing the controllability of the channel forming in the channel region 103 during operation of a device 100S. Thus, the implantation process 108S is performed with appropriate process parameters, such as implantation dose, energy and, as shown, tilt angle with respect to a direction substantially perpendicular to the layer 102, so as to obtain the implantation region 106S extending to a certain degree below the structure defined by the gate electrode 104 and the spacer 107, which acts as an implantation mask. It is to be noted that, however, a moderately high implantation dose and thus dopant concentration in the shallow region 106S is required in order to provide the efficient compensating mechanism for reducing short channel effects, such as reduced threshold roll off, to obtain enhanced channel controllability. On the other hand, the second transistor 100D is subjected to a halo implantation 108D, which is designed to provide a lower dopant concentration, thereby requiring a significantly greater depth so as to provide a moderately high compensation effect with respect to the threshold variance. It should be appreciated that a thickness of the gate insulation layer 105 may typically range from 1-3 nm and thus may not be significantly reduced on the basis of frequently used materials, such as silicon dioxide, silicon nitride and the like. The transistors 100S, 100D may be formed on the basis of well-established techniques, which include substantially the same processes for both transistors except for the halo implantations 108S, 108D.

FIG. 1*b* schematically shows the transistors 100S and 100D in a final manufacturing stage. Both transistors 100S, 100D may comprise an appropriate sidewall spacer structure 111, which may comprise a plurality of individual spacer elements and appropriate liner materials, depending on process and device requirements. Moreover, drain and source regions 110 connected to respective extension regions 109 may be formed within the semiconductor layer 102 adjacent to the channel region 103, wherein the extension regions 109 may form with the respective halo region 106S or 106D a PN junction, as is previously explained. Moreover, metal silicide regions 112 may be formed within the drain and source regions 110 and the gate electrode 104 in order to reduce the series resistance for connecting to the gate electrode 104 and the drain and source regions 110.

Typically, the transistors 100S, 100D may be formed by performing an appropriate implantation process for forming extension regions 109, possibly by providing an appropriate spacer element (not shown) or on the basis of the spacer 107, depending on the process and device requirements. Thereafter, the spacer structure 111 may be formed on the basis of well-approved techniques including the deposition of an appropriate material, such as silicon nitride, and a subsequent anisotropic etch process. Thereafter, a further implantation process may be performed in order to introduce dopant material for forming the deep drain and source regions 110. It should be noted that other implantation processes, as well as any intermediate anneal processes for activating respective dopant material, may also have been performed prior to the formation of the extension regions 109 and the drain and source regions 110 or may have been performed intermittently. After the completion of the respective implantation and anneal processes, thereby forming the PN junction between the extension region 109 and the halo regions 106S or 106D, the metal silicide regions 112 may be formed on the basis of any appropriate process technique, for instance involving the deposition of any appropriate refractory metal, such as cobalt, titanium, nickel, platinum or combinations thereof, with a subsequent heat treatment for forming a respective metal silicide.

FIG. 1*c* schematically illustrates the behavior of the transistors 100S, 100D with respect to a variation of threshold voltage with gate length, i.e., in FIGS. 1*a* and 1*b* the horizontal dimension of the gate electrodes 104, for otherwise identical configuration, wherein, as previously explained, a shallow halo implantation region, such as the region 106S, may provide a reduced variance of the threshold voltage for a decreasing gate length, as is indicated by the curve A in FIG. 1*c*. On the other hand, a moderately deep halo implantation region, such as the region 106D, may, for an otherwise identical transistor configuration, result in a significantly pronounced threshold roll off, thereby rendering this type of transistor less appropriate for sophisticated applications. Although the transistor 100S may be advantageous in view of its behavior with respect to the threshold roll off, the moderately high dopant concentration in the region 106S may, however, have a significant impact on the overall series resistance of the transistor 100S, thereby significantly reducing its current drive capability. That is, due to the moderately high dopant concentration in the halo implantation region 106S, a high degree of counter-doping is provided in the extension region 109, thereby reducing the conductivity thereof. Hence, a portion 109A between the metal silicide 112 and the channel region 103 may have an increased resistance compared to the respective region 109A of the transistor 100D, which has a significantly lower dopant concentration in the respective halo region 106D. Consequently, typical transistor configurations for advanced applications may represent a compromise between enhanced threshold roll off behavior with respect to drive current capability.

In view of the situation described above, there exists a need for an enhanced technique for forming transistor elements while avoiding one or more of the problems identified above or at least reducing the effects thereof.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the manufacturing of transistor elements with enhanced behavior with respect to a reduced threshold variance, while at the same time providing a high drive current capability. For this purpose, a halo region is locally formed adjacent to a respective channel region so as to significantly reduce or substantially completely avoid counter-doping of a respective drain and source extension region. In this way, a shallow halo region having the required high dopant concentration may be formed substantially without negatively affecting the series resistance between the respective PN junction and a metal silicide. Moreover, in some aspects of the present invention, the local formation of the halo region may be combined with the provision of a strained semiconductor material in the drain and source regions, thereby enabling the creation of a respective strain in the channel region, which in turn results in a significantly enhanced transistor performance.

According to one illustrative embodiment of the present invention, a method comprises forming a doped region adjacent to a channel region of a field effect transistor, wherein the doped region comprises a first dopant species of a first conductivity type. Moreover, a portion of the doped region is replaced by a semiconductor material, and a second dopant species of a second conductivity type that differs from the first conductivity type is introduced into the semiconductor material so as to form a PN junction with the first dopant species adjacent to the channel region.

According to another illustrative embodiment of the present invention, a method comprises forming a recess in a crystalline semiconductor region to extend below an etch mask formed above the crystalline semiconductor region. Furthermore, a doped region extending below the etch mask is formed on the basis of the recess, wherein the doped region comprises a first dopant species of a first conductivity type. Furthermore, a semiconductor material is formed in the recess, wherein the semiconductor material comprises a second dopant species of a second conductivity type that differs from the first conductivity type and wherein the first and second dopant species form a PN junction.

According to yet another illustrative embodiment of the present invention, a semiconductor device comprises a gate electrode structure formed above a channel region and a drain region and a source region formed adjacent to the channel region so as to form a PN junction therewith, wherein the drain and source regions have a low resistance region of reduced concentration of counter-doping compared to a concentration of counter-doping at the PN junction. Moreover, the semiconductor device comprises a metal silicide region formed in the drain and source regions, wherein the metal silicide region connects to the low resistance region.

BRIEF DESCRIPTION OF THE DRAWINGS

The invention may be understood by reference to the following description taken in conjunction with the accompanying drawings, in which like reference numerals identify like elements, and in which.

Figure 1A:
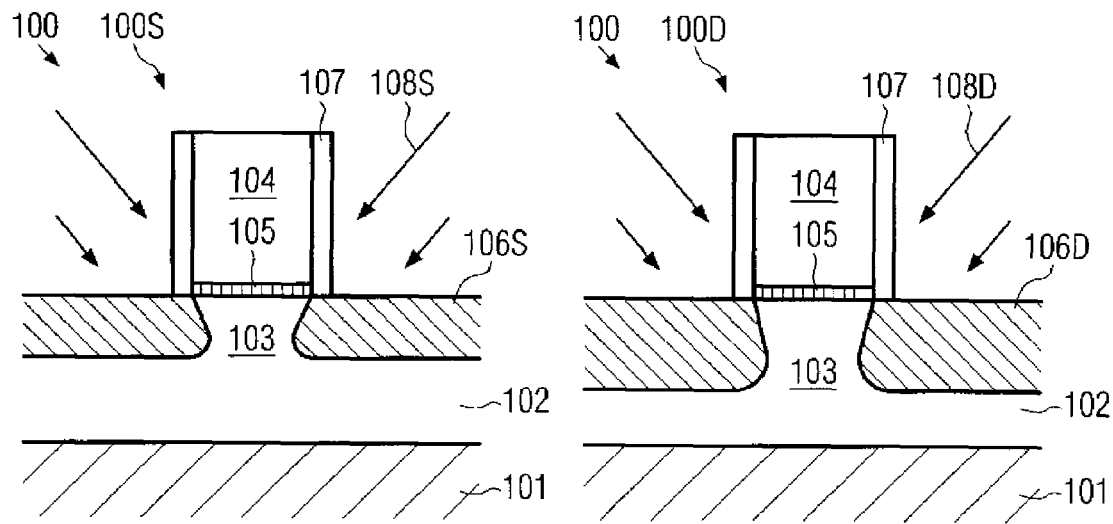
FIGS. 1a-1b schematically show cross-sectional views of a semiconductor device comprising transistor elements in various manufacturing stages with a shallow halo region and a deep halo region according to conventional process strategies.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention relates to a technique for the formation of halo regions having a high dopant concentration and which are located close to the channel region in order to obtain an enhanced behavior with respect to a reduced threshold variance with gate length. For this purpose, in some illustrative embodiments, material of the halo region may be selectively removed and may be replaced by a semiconductor material that may be doped in accordance with device requirements, wherein a substantially lower level of counter-doping is generated for the respective extension and drain and source regions. In some embodiments, the corresponding semiconductor material may be provided in the form of a strained semiconductor material, which may then induce a respective strain in the adjacent channel region, thereby even further enhancing the performance of the respective transistor element. In other illustrative embodiments, the halo region may be formed in a highly local fashion on the basis of epitaxial growth techniques and/or diffusion processes, thereby substantially avoiding implantation-induced crystal damage, which may otherwise be generated when the dopant species for the halo region is introduced by ion implantation techniques.

Figure 2A:
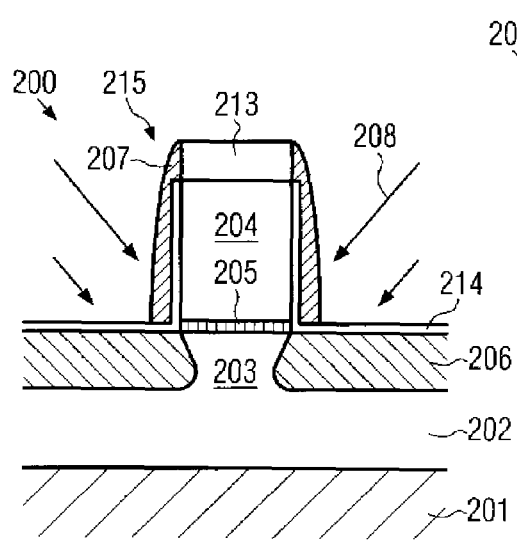
FIGS. 2a-2d schematically show cross-sectional views of a transistor element during various manufacturing stages for forming a shallow halo region with reduced counter-doping of drain and source regions according to illustrative embodiments of the present invention.

With reference to FIGS. 2a-2d, 3a-3c and 4a-4c, further illustrative embodiments of the present invention will now be described in more detail. FIG. 2a schematically illustrates a cross-sectional view of a semiconductor device 200, which may represent, in illustrative embodiments, a field effect transistor of a specific conductivity type, such as a P-channel transistor or an N-channel transistor. The device 200 may comprise a substrate 201, which may represent any appropriate substrate for forming thereon a crystalline semiconductor layer 202. For example, the substrate 201 may represent a bulk semiconductor substrate, such as a silicon substrate, a silicon-on-insulator (SOI) substrate or any other appropriate carrier material. The semiconductor layer 202 may, in some illustrative embodiments, represent a silicon-based layer, i.e., a crystalline layer having a diamond structure and including a certain amount of silicon, for instance approximately 50 atomic percent silicon or more. In other embodiments, the semiconductor layer 202 may represent any other appropriate semiconductor material, such as silicon/germanium and the like. A mask feature 215 may be formed above the semiconductor layer 202, thereby covering a channel region 203. The mask feature 215 may comprise, in some illustrative embodiments, a gate electrode 204, which may be formed on a gate insulation layer 205, wherein the gate electrode 204 may comprise polysilicon or any other appropriate material according to process and device requirements. Moreover, the mask feature 215, when comprising the gate electrode 204, may comprise a capping layer 213 and sidewall spacers 207. In some illustrative embodiments, a liner 214, for instance in the form of silicon dioxide and the like, may be formed between the spacer 207 and the gate electrode 204 and may also cover horizontal portions of the semiconductor layer 202. It should be appreciated that the mask feature 215 may also represent a placeholder for a gate electrode to be formed in a later manufacturing stage, wherein, in this case, the feature 215 may be substantially made of a single material having appropriate dimensions for the gate electrode still to be formed and for serving as a mask for subsequent processes, such as an ion implantation for forming a doped region 206 including a dopant species of a first conductivity type that is appropriate for forming a PN junction with drain and source regions and extension regions that are still to be formed. In the following, the doped region 206 may also be referred to as a halo region, wherein the region 206 may have an appropriate shape for providing the desired behavior with respect to threshold variance, as is discussed above.

Figure 1B:
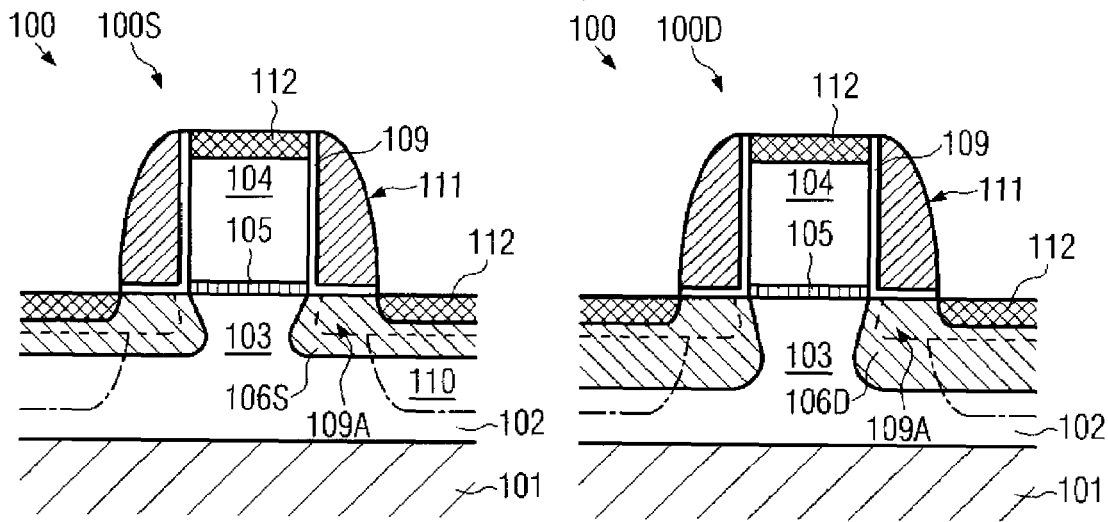
Figure 1C:
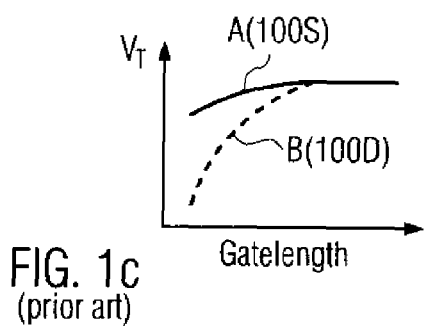
FIG. 1c schematically illustrates the behavior of the threshold voltage in relation to the gate length for transistor devices having a shallow halo region and a deep halo region.

A typical process flow for forming the semiconductor device 200 as shown in FIG. 2a may comprise the following processes. After providing the substrate 201 or forming the same, for instance when the substrate 201 is to represent an SOI substrate, the semiconductor layer 202 may be formed, for instance by epitaxial growth techniques. During or after the epitaxial growth process, an appropriate vertical dopant profile may be produced by, for instance, ion implantation, wherein, for convenience, any such dopant distribution is not shown. Thereafter, a gate insulation material may be formed, for instance by deposition and/or oxidation, followed by the deposition of an appropriate gate electrode material when it is assumed that the mask feature 215 comprises the gate electrode 204. Moreover, in this case, an appropriate capping material, such as silicon nitride, may be formed on the gate electrode material and these layers may be patterned on the basis of sophisticated lithography and etch techniques so as to obtain the gate electrode 204 covered by the capping layer 213. Thereafter, exposed portions of the gate insulation layer may be removed in order to form the gate insulation layer 205 as shown in FIG. 2a. Next, the liner 214 may be formed, for instance by oxidizing the device 200 to obtain a desired thickness for the liner 214. Subsequently, an appropriate spacer material may be deposited, for instance in the form of silicon nitride, wherein a thickness of the spacer layer may be selected in view of a desired width of the spacers 207, which may then be formed by an anisotropic etch process. Thereafter, the ion implantation process 208 may be performed on the basis of appropriate process parameters, i.e., the dose and energy as well as a tilt angle may be selected on the basis of design rules, which may be tailored for obtaining a desired behavior with respect to the threshold variance, as is explained above. That is, for otherwise identical design criteria of the device 200 with respect to the device 100S, the same implantation parameters may be selected when a behavior as qualitatively illustrated in FIG. 1c is desired for the device 200. Thus, the process 208 may be designed for obtaining a halo region 206 with high efficiency for reducing threshold roll off, contrary to conventional strategies, in which typically a reduced dopant concentration in the region 206 is provided as a compromise in view of a less reduced current drive capability.

Figure 2B:
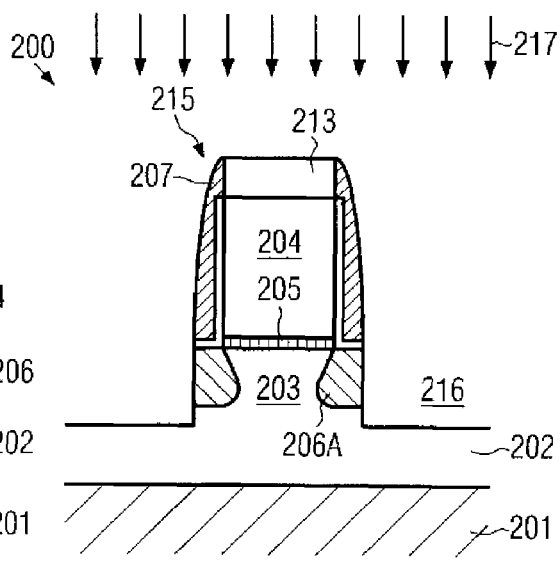

FIG. 2b schematically illustrates the device 200 in an advanced manufacturing stage, in which a recess 216 is formed adjacent to the channel region 203 so that a portion of the doped region 206 is removed. For this purpose, the device 200 is subjected to an anisotropic etch process 217, wherein the mask feature 215, which may represent the encapsulated gate electrode 204, may have a high selectivity with respect to the material of the layer 202. For example, highly selective etch processes for silicon and silicon nitride are well established and may be used. During the etch process 217, material from the exposed portion of the region 206 may be removed down to a depth, at which a significant reduced concentration of the first dopant species is encountered. It should be appreciated that, due to the nature of the process 208, the boundaries of the region 206 may not represent sharp transitions but may be a more or less gradual transition of the dopant concentration. It should also be appreciated that the remaining material of the layer 202 may have incorporated therein the dopant species of the first conductivity type. However, at least a portion of the doped region 206, having a high dopant concentration as required in the vicinity of the channel region 203 for reducing threshold variance, may be removed by the etch process 217, thereby leaving a portion 206A having the characteristics as required for a halo region in combination with a respective extension region still to be formed.

Figure 2C:
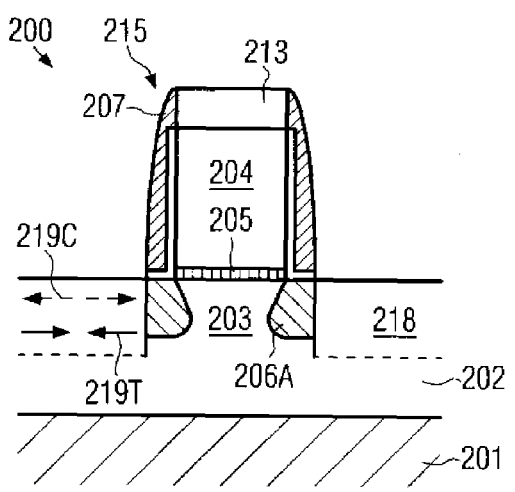

FIG. 2c schematically illustrates the device 200 in a further advanced manufacturing stage. The device 200 may comprise a semiconductor material 218, which in some illustrative embodiments may represent substantially the same material as is provided for the layer 202, such as silicon. In other illustrative embodiments, the semiconductor material 218 may comprise a strained semiconductor material, wherein, in some embodiments, a material of compressive strain, as indicated by the arrows 219C, may be included, while, in other embodiments, a material of tensile strain, as indicated by the arrows 219T, may be provided. Moreover, irrespective of whether the semiconductor material 218 is provided as a strained or unstrained material, in some embodiments, a desired type of dopant may be included in the material 218, such as a dopant species of a second conductivity type that differs from the conductivity type of the dopant in the doped region 206A, while, in other embodiments, the material 218 may be formed as a substantially undoped semiconductor material.

The semiconductor material 218 may be formed by well-established selective epitaxial growth techniques, in which the material 218 is selectively deposited in a chemical vapor deposition atmosphere so as to adhere to the exposed crystalline portions within the recess 216, while substantially not adhering to other materials, such as the silicon nitride or any other appropriate dielectric material provided in the capping layer 213 and the spacers 207. As explained above, during the selective epitaxial growth process, a precursor material may be introduced into the deposition atmosphere in order to obtain a desired degree of dopant concentration in the material 218, wherein the addition of a respective dopant material may be initiated at any appropriate point in time during the deposition process. Moreover, by adding a material that has a different lattice spacing compared to the material of the layer 202, which acts as a crystalline template, a desired strain of the resulting material may be obtained, such as the compressive strain 219C or the tensile strain 219T, when for instance silicon/germanium and silicon/carbon, respectively, are used as the material 218. Moreover, the selective epitaxial growth process may be controlled so as to obtain a desired amount of material 218 in the recess 216, wherein a substantially flush configuration, as shown in FIG. 2c, may be achieved, while in other embodiments a certain degree of overgrowth or a certain amount of underfill may be created during the epitaxial growth process, depending on device requirements.

Figure 2D:
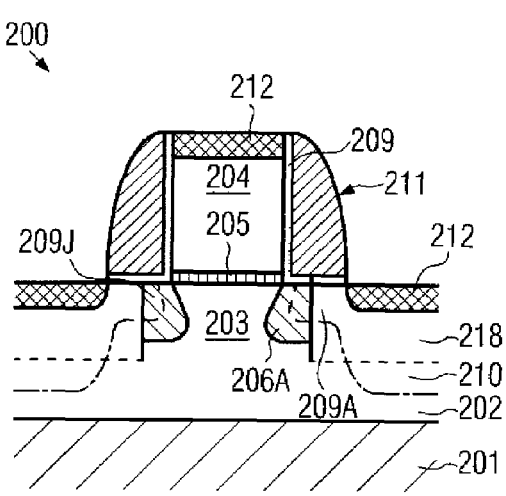

FIG. 2d schematically illustrates the semiconductor device 200 in a further manufacturing stage. The device 200 comprises a drain and source region 210, which may be formed in the material 218 and, depending on the design of the device, also within the layer 202. Furthermore, respective extension regions 209A are formed within the material 218, wherein the extension regions 209A and the drain and source regions 210 include a required dopant species of a second conductivity type so that the portion 209A of the extension region forms a PN junction 209J with the halo region 206A. Consequently, by providing the halo region 206A with a dopant concentration and a depth selected so as to obtain the desired performance with respect to the threshold variance, the respective PN junction 209J has the desired characteristics, wherein a degree of counter-doping at the PN junction 209J may substantially correspond to that of the device 100S, wherein, however, contrary to this conventional design, the corresponding degree of counter-doping in the portion 209A is then significantly less due to the removal of the respective counter-doped material in the previously performed etch process 217. Consequently, the resulting conductivity of the portion 209A is significantly increased compared to, for instance, the portion 109A of the device 100S as illustrated in FIG. 1b. Moreover, the device 200 may comprise a sidewall spacer structure 211 formed on the gate electrode 204 and metal silicide regions 212 located in the gate electrode 204 and the drain and source regions 210.

A typical process flow for forming the device 200 as shown in FIG. 2d may comprise the following processes. After the formation of the material 218, the capping layer 213 and the spacers 207 may be removed, for instance on the basis of hot phosphoric acid when comprised of silicon nitride, and thereafter a further spacer element (not shown), if required, may be formed in order to form the extension region 209A by ion implantation. In other illustrative embodiments, when the spacers 217 are deemed appropriate for the formation of the extension region 209A, the respective implantation may be performed prior to the removal of the spacers 207. Thereafter, the spacer structure 211 may be formed wherein, as previously explained, any intermediate spacer elements and implantation processes, such as amorphization implantation, buffer implantation and the like, may be performed, if required. Furthermore, depending on the process strategy, intermediate anneal processes may be carried out to activate the dopants and re-crystallize implantation-induced damage. Based on the spacer structure 211, the deep drain and source regions 210 may be formed with a subsequent anneal process and thereafter the metal silicide regions 212 may be formed on the basis of any appropriate process technique, as is also for instance described with reference to the devices 100S, 100D.

Consequently, the semiconductor device 200 may have the enhanced performance with respect to threshold roll off, while additionally providing low series resistance between the PN junction 209J and the metal silicide regions 212, due to the reduced concentration of the counter-dopants contained in the extension region 209A. Moreover, depending on whether or not the material 218 may be provided as a strained material, an additional performance gain may be obtained, since a corresponding strain may be created in the channel region 203, thereby modifying the mobility of the respective majority charge carriers. For instance, if the device 200 represents an N-channel transistor, the material 218 may include a semiconductor material such as silicon/carbon in order to create a tensile strain, which is transferred into the channel region 203, thereby increasing the electron mobility. In other cases, the device 200 may represent a P-channel transistor, wherein a silicon/germanium material may be comprised in the material 218 having a compressive strain, which translates into a respective compressive strain in the channel region 203, thereby increasing the hole mobility and thus the respective current drive capability. Thereafter, a respective contact etch stop layer (not shown) may be provided above the transistor 200, thereby providing the potential to even further enhance the strain in the channel region 203 by forming the respective contact etch stop layer as a highly stressed layer, including tensile or compressive stress.

With reference to FIGS. 3a-3c and 4a-4c, further illustrative embodiments of the present invention will now be described in which a corresponding halo region may be formed substantially without an ion implantation process, thereby reducing a possible effect of the implantation on the further device characteristics, wherein, specifically for transistor configurations including strained semiconductor materials, a respective strategy may be advantageous to reduce crystal defects, which may otherwise result in a certain degree of strain relaxation.

Figures 3A, 3B:
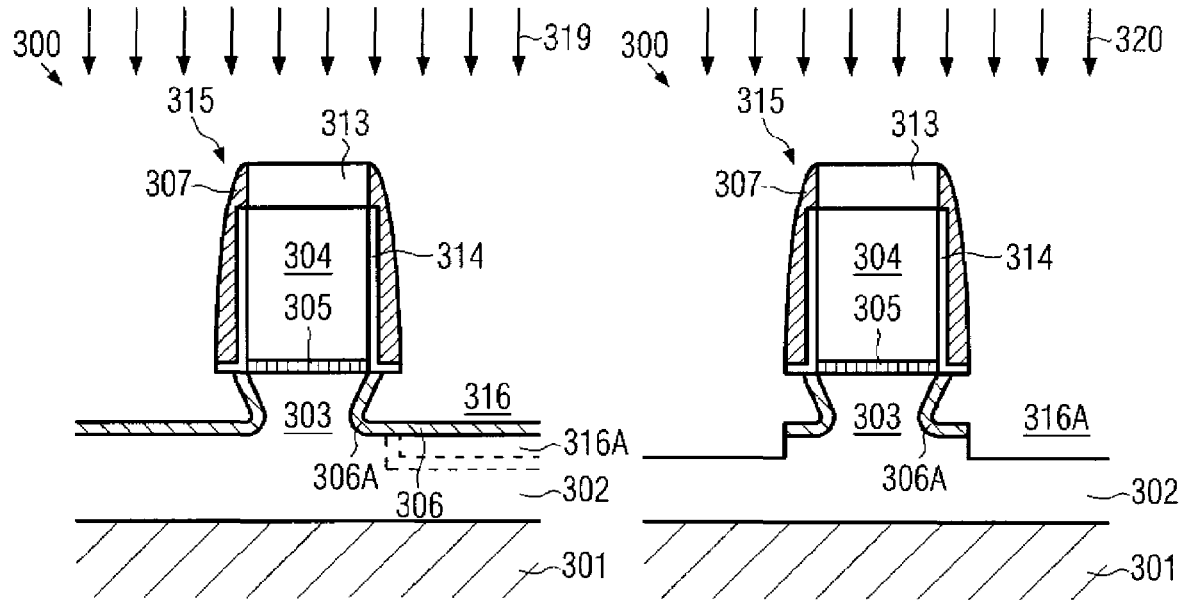
FIGS. 3a-3c schematically illustrate cross-sectional views of a transistor element during the formation of a local halo region on the basis of an epitaxial growth process according to still other illustrative embodiments of the present invention.

In FIG. 3a, a semiconductor device 300 is illustrated in a cross-sectional view during an intermediate manufacturing stage. The device 300 may comprise substantially the same components as previously described with respect to the device 200. Thus, the device 300 may comprise a substrate 301, a semiconductor layer 302 including a channel region 303, above which may be formed a gate electrode 304 separated from the channel region 303 by a gate insulation layer 305. Moreover, the gate electrode 304 may be encapsulated by a capping layer 303 and spacers 307 and a liner 314. For these components, the same criteria apply as previously outlined with respect to the respective components of the device 200. Hence, a detailed description of these components as well as the process for manufacturing the same is omitted.

Furthermore, in this manufacturing stage, the device 300 may comprise a recess 316 formed adjacent to the encapsulated gate electrode 304. The recess 316 may extend a certain degree below the spacer 307, that is the spacer 307 may be undercut to a certain degree, wherein the degree of undercut may substantially correspond to a desired location of a region of increased dopant concentration so as to form a halo region. The recess 316 may be formed on the basis of an isotropic etch process for selectively etching the semiconductor material of the layer 302, such as silicon. Consequently, the corresponding process may result in a respective under-etch area so that the recess 316 may extend below the spacer 307. It should be appreciated that appropriate isotropic etch recipes are well established in the art. It should further be appreciated that the corresponding isotropic etch process may be controlled such that a desired degree of under-etching may be obtained, which may then substantially define the shape of a halo region 306 that may be subsequently formed on the basis of a selective epitaxial growth process 319. In some embodiments, a depth of the recess 316, i.e., a depth prior to the selective epitaxial growth process 319, may be defined independently from the degree of under-etching under the spacer 307 by performing an anisotropic etch process after a desired degree of under-etching is achieved.

Thereafter, the epitaxial growth process 319 may be performed on the basis of any appropriate semiconductor material, wherein additionally a dopant species of the first conductivity type may be added to the deposition atmosphere of the process 319 in order to provide the required halo dopant concentration. Consequently, the corresponding dopant species may be incorporated into the crystalline structure of material deposited during the process 319, substantially without creating crystalline defects. During the growth process 319, a thickness of the material deposited for forming the region 306 may be controlled to obtain a desired thickness or width between the channel region 303 and an extension region still to be formed. In some illustrative embodiments, when horizontal portions of the region 306 may be considered as not unduly affecting the overall performance of the transistor 300, the epitaxial growth process 319 may be continued and the supply of the first dopant species discontinued to grow a substantially undoped material, or, in other illustrative embodiments, to form the further selectively deposited material as a doped material containing a second dopant species having a second conductivity type corresponding to the type required for forming a PN junction. In still other illustrative embodiments, when the recess 316 has been formed on the basis of a combination of an isotropic etch process and a subsequent anisotropic etch process, as indicated by the dashed lines, thereby creating a corresponding recess 316A, the growth process 319 may result in a region 306, the horizontal boundary of which may be significantly offset from a respective extension region still to be formed in the recess 316A. Also in this case, the process 319 may be continued on the basis of non-doped material or on the basis of a doped material, depending on the process requirements. For instance, semiconductor material having the second dopant species may be deposited with a dopant concentration as required for respective extension regions, thereby creating highly controlled PN junctions with a portion 306A of the previously deposited doped material. It should be appreciated that, irrespective of the regime used for the deposition process 319, the respective materials may be provided in the form of a strained material, thereby positioning the corresponding strained material close to the channel region 303. For instance, in the arrangement shown in FIG. 3a, the portion 306A may therefore be comprised of a strained material, such as silicon/germanium or silicon/carbon including the required degree of dopant concentration. After the deposition process 319, when the recess 316A has been filled with an appropriate semiconductor material, further processing may be continued as is for instance described with reference to FIG. 2d, wherein it should be appreciated that an implantation sequence for forming at least respective extension regions may possibly be omitted when, after the deposition of the material for the halo region 316, an appropriately doped semiconductor material is provided.

FIG. 3b schematically illustrates the device 300 according to a further illustrative embodiment, wherein, starting from the arrangement as shown in FIG. 3a, i.e., with the recess 316 partially filled with material for forming the halo region 306, an anisotropic etch process 320 may be performed to remove exposed portions of the region 306, thereby leaving the portion 306A while removing the highly doped material of the region 306, wherein, in some embodiments, the process 320 may also be used for providing a desired depth of the recess 316, now indicated as 316A.

Figure 3C:
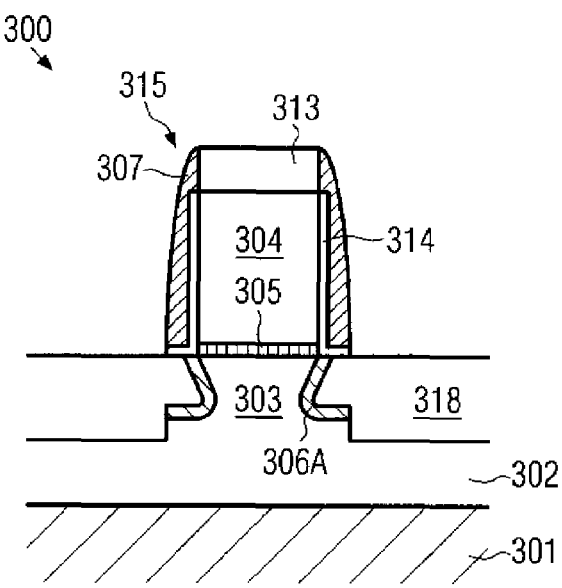

FIG. 3c schematically illustrates the device 300 in a further advanced manufacturing stage, in which the recess 316A may be filled with an appropriate semiconductor material on the basis of a further selective epitaxial growth process. Also in this case, the material 318 may be provided in the form of a non-doped or doped material, wherein the degree of doping may be selected to correspond to the desired dopant concentration of an extension region to be formed within the material 318. Consequently, a corresponding extension implantation may be omitted or may be formed with a reduced dose, thereby significantly reducing crystalline defects. In still other embodiments, the material 318 may be provided in the form of a strained semiconductor material, as is previously explained. Thereafter, further processing may be continued as is also described with reference to FIG. 2d.

Figure 4A:
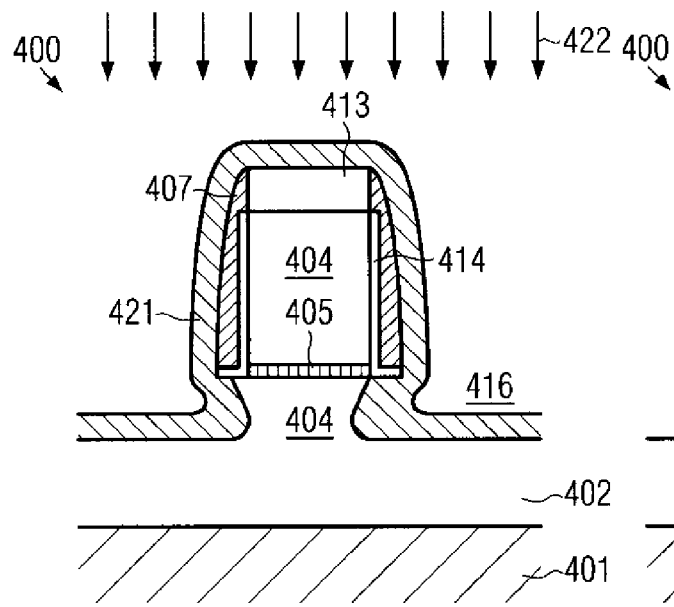
FIGS. 4a-4c schematically show cross-sectional views of a transistor element during the local formation of a shallow halo region on the basis of a diffusion process in accordance with yet other illustrative embodiments of the present invention.

FIG. 4a schematically illustrates a semiconductor device 400, which may have substantially the same configuration as the device 300, wherein the components are denoted by the same reference numbers, except for a leading "4" instead of a leading "3." Thus, the device 400 may comprise a recess 416 formed adjacent to the encapsulated gate electrode 404 wherein, contrary to the device 300, the recess may be partially or completely filled with a sacrificial layer 421, which may be comprised of any appropriate material, such as silicon dioxide, silicon nitride and the like. The sacrificial layer 421 may represent a layer containing a high amount of dopant material of a first type, as may be required for the formation of a halo region. The device 400 may be formed in accordance with the same process strategies as are previously explained with reference to the device 200 and the device 300. That is, the recess 416 may be formed on the basis of an isotropic etch process, possibly in combination with a subsequent anisotropic process as is previously described. Thereafter, the sacrificial layer 421 may be formed on the basis of any appropriate deposition technique, such as plasma enhanced chemical vapor deposition (PECVD), wherein an appropriate dopant precursor material is provided to incorporate a required degree of dopant material. In some illustrative embodiments, the device 400 may be subjected to an anisotropic etch process 422 in order to remove a portion of the layer 421 within the recess 416. In other illustrative embodiments, the anisotropic process 422 may be performed at a later stage and a heat treatment may first be carried out in order to drive dopant material into the adjacent material of the semiconductor layer 402, thereby creating the desired dopant concentration in the material of the layer 402 adjacent to the sacrificial layer 421.

Figure 4B:
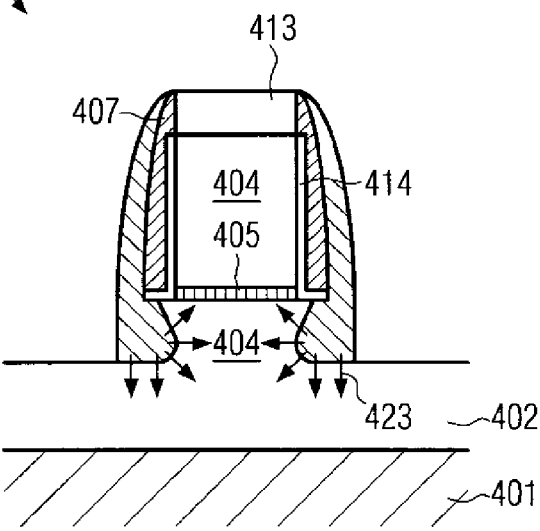

FIG. 4b schematically illustrates the device 400 after the completion of the anisotropic etch process 422, thereby removing horizontal portions of the sacrificial layer 421 prior to a heat treatment 423 for locally driving dopant material into the adjacent semiconductor material. As previously explained, when a respective heat treatment may be performed on the basis of the non-etched layer 421 prior to the etch process 422, corresponding dopant material may also be driven into horizontal portions of the layer 402, which may then be removed, if required, by a subsequent anisotropic etch process similar to the process 422. For instance, the sacrificial layer 421 as shown in FIG. 4a may, after a corresponding heat treatment, be removed on the basis of a selective anisotropic etch process for removing material of the layer 402, thereby also removing non-wanted doped portions thereof. In other embodiments, after a heat treatment on the basis of the complete sacrificial layer 421, the process 422 may be performed to provide the device as shown in FIG. 4b and subsequently it may be further etched into the material of the layer 402 on the basis of a respective etch chemistry in order to remove a doped portion thereof.

Figure 4C:
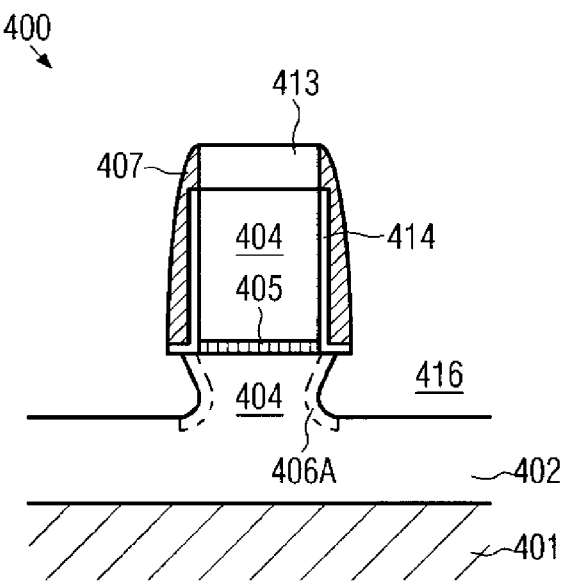

FIG. 4c schematically illustrates the device 400 in a further advanced manufacturing stage, wherein, starting from the device as shown in FIG. 4b, the rest of the sacrificial layer 421, which may have been used for thermally driving dopant material into the semiconductor material adjacent to the channel region 403, is removed on the basis of a selective isotropic etch process. Thus, a doped region 406A is formed, which may have the required dopant concentration of the dopant species of the first conductivity type so as to act as an appropriate halo region. Thereafter, further processing may be continued by performing a selective epitaxial growth process, as previously described, to fill the recess 416 with appropriate semiconductor material, doped or non-doped, strained or non-strained, as is previously described. Hence, in this case, the halo region 406A may also be formed in a highly localized manner with a reduced degree of defects, thereby enhancing even more the performance of the device 400.

As a result, the present invention provides a technique for the formation of a shallow halo region in a highly localized manner to provide the potential of significantly reducing the threshold voltage variance, while simultaneously providing a substantially non-degraded or even enhanced current drive capability. For this purpose, a portion of the halo region may be removed or may not be formed in an area which corresponds to an extension region, thereby significantly reducing the degree of counter-doping in the corresponding extension region, wherein, in some illustrative embodiments, even a substantially complete removal of the counter-doping may be achieved. For this purpose, the drain and source regions may be recessed after a halo implantation and may be subsequently filled with a semiconductor material, which may be provided in the form of a strained or non-strained material wherein a specific degree of doping may also be accomplished. In other embodiments, the shape and location of the halo region may be established on the basis of an isotropic etch process with a subsequent epitaxial growth process or a thermally driven diffusion process. In these cases, a significantly reduced rate of crystal defects may be achieved. Thus, in combination with strained semiconductor material in the drain and source regions, a high drive current capability is achieved, due to the reduced series resistance caused by the significantly reduced counter-doping in the drain and source extension regions and increase of charge carrier mobility, wherein, in some embodiments, strained material may also be positioned in close proximity to the channel region, which may further enhance the strain-inducing mechanism.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
   forming a recess adjacent to a channel region of a field effect transistor;
   forming a doped region in said recess by an epitaxial growth process, said doped region comprising a first dopant species of a first conductivity type;
   replacing a portion of said doped region by a semiconductor material; and
   introducing a second dopant species of a second conductivity type other than said first conductivity type into said semiconductor material so as to form a PN junction with said first dopant species adjacent to said channel region.

2. The method of claim 1, wherein replacing a portion of said doped region comprises forming a second recess adjacent to said channel region and forming said semiconductor material by an epitaxial growth process.

3. The method of claim 2, wherein said second dopant species is at least partially introduced in said semiconductor material during said epitaxial growth process.

4. The method of claim 2, wherein said second dopant species is at least partially introduced in said semiconductor material by an implantation process.

5. The method of claim 2, wherein said semiconductor material is formed as a strained semiconductor material.

6. The method of claim 5, wherein said semiconductor material is a compressively strained semiconductor material.

7. The method of claim 5, wherein said semiconductor material is formed with a tensile strain.

8. The method of claim 1, wherein said recess is formed by an etch process on the basis of an etch mask covering said channel region, and wherein said etch process is controlled to provide a defined under-etching of said etch mask.

9. A method, comprising:
   forming a recess in a crystalline semiconductor region so as to extend below an etch mask formed above said crystalline semiconductor region;
   forming a doped region extending below said etch mask by a selective epitaxial growth process, said doped region comprising a first dopant species of a first conductivity type;
   removing a portion of said doped semiconductor region by an anisotropic etch process; and
   forming a semiconductor material in said recess after removing said portion of said doped semiconductor region, said semiconductor material comprising a second dopant species of a second conductivity type other than said first conductivity type, said first and second dopant species forming a PN junction.

10. The method of claim 9, wherein said etch mask comprises a gate electrode of a field effect transistor.

11. The method of claim 9, wherein said semiconductor material is formed by a selective epitaxial growth process.

12. The method of claim 11, wherein said semiconductor material is formed as a strained semiconductor material.

13. A semiconductor device, comprising:
    a gate electrode structure formed above a channel region;
    a drain region and a source region formed in a recess, a first portion of the recess adjacent the channel region being lined by a first doped region, and a second portion of the recess adjacent the first portion being lined and filled by a semiconductor material without being lined by the first doped region, the first doped region comprising an epitaxially-grown material including a first dopant species of a first conductivity type and being disposed adjacent said channel region, the semiconductor material comprising a second dopant species of a second conductivity type other than said first conductivity type, said first and second dopant species forming a PN junction adjacent to said channel region in said first portion, said drain and source regions having a low resistance region of reduced concentration of counter-doping in said second portion compared to a concentration of counter-doping at said PN junction; and
    a metal silicide region formed in said drain and source regions, said metal silicide region connecting to said low resistance region.

14. The semiconductor device of claim 13, wherein said drain and source regions comprise a strained semiconductor material.

15. A method, comprising:

forming a recess in a crystalline semiconductor region so as to extend below an etch mask formed above said crystalline semiconductor region;

forming within said recess under said etch mask a doped sacrificial layer including a first dopant species of a first conductivity type;

heat treating said doped sacrificial layer to drive a portion of said first dopant species into said crystalline semiconductor region to define a doped region extending below said etch mask;

removing said doped sacrificial layer; and forming a semiconductor material in said recess, said semiconductor material comprising a second dopant species of a second conductivity type other than said first conductivity type, said first and second dopant species forming a PN junction.

16. The method of claim 15, wherein forming said doped sacrificial layer comprises depositing said doped sacrificial layer and removing a portion of said doped sacrificial layer by an anisotropic etch process prior to heat treating said doped sacrificial layer.

17. The method of claim 15, wherein said etch mask comprises a gate electrode of a field effect transistor.

18. The method of claim 15, wherein said semiconductor material is formed by a selective epitaxial growth process.

19. The method of claim 18, wherein said semiconductor material is formed as a strained semiconductor material.

* * * * *